United States Patent
Agarwal et al.

(10) Patent No.: US 7,818,137 B2
(45) Date of Patent: Oct. 19, 2010

(54) CHARACTERIZATION CIRCUIT FOR FAST DETERMINATION OF DEVICE CAPACITANCE VARIATION

(75) Inventors: Kanak B. Agarwal, Austin, TX (US); Jerry D. Hayes, Georgetown, TX (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/361,891

(22) Filed: Jan. 29, 2009

(65) Prior Publication Data

US 2009/0160463 A1    Jun. 25, 2009

Related U.S. Application Data

(62) Division of application No. 11/961,442, filed on Dec. 20, 2007.

(51) Int. Cl.
  *G01R 27/00*    (2006.01)
  *G01R 31/00*    (2006.01)
  *G01R 31/14*    (2006.01)

(52) U.S. Cl. ......................................... 702/117; 702/65

(58) Field of Classification Search .................... 702/17, 702/64, 65, 117, 118, 190, 191; 340/660, 340/664; 324/76.11
See application file for complete search history.

(56) References Cited

U.S. PATENT DOCUMENTS

| | | | |
|---|---|---|---|
| 5,780,884 A | 7/1998 | Kumagai et al. | |
| 6,275,061 B1 | 8/2001 | Tomita | |
| 6,630,840 B2 | 10/2003 | Tomita | |
| 6,873,173 B2 | 3/2005 | Kollmer et al. | |
| 6,885,212 B2 | 4/2005 | Yamamoto et al. | |
| 6,985,003 B2 | 1/2006 | Li et al. | |
| 7,312,625 B1 | 12/2007 | Paak et al. | |
| 7,397,259 B1 | 7/2008 | Agarwal et al. | |
| 7,408,372 B2 | 8/2008 | Agarwal et al. | |
| 7,423,446 B2 | 9/2008 | Agarwal et al. | |
| 7,589,550 B2 | 9/2009 | Smith | |

(Continued)

OTHER PUBLICATIONS

Schwartz, Mischa, "Information Transmission, Modulation and Noise" 1980, $3^{rd}$ Ed, McGraw-Hill, pp. 338-342.

(Continued)

*Primary Examiner*—Michael P Nghiem
(74) *Attorney, Agent, or Firm*—Mitch Harris, Atty at Law, LLC; Andrew M. Harris; Libby Z. Toub

(57) ABSTRACT

A test circuit for fast determination of device capacitance variation statistics provides a mechanism for determining process variation and parameter statistics using low computing power and readily available test equipment. A test array having individually selectable devices is stimulated under computer control to select each of the devices sequentially. A test output from the array provides a current or voltage that dependent on a particular device parameter. The sequential selection of the devices produces a voltage or current waveform, characteristics of which are measured using a digital multi-meter that is interfaced to the computer. The rms value of the current or voltage at the test output is an indication of the standard deviation of the parameter variation and the DC value of the current or voltage is an indication of the mean value of the parameter.

18 Claims, 4 Drawing Sheets

U.S. PATENT DOCUMENTS

| | | |
|---|---|---|
| 7,609,080 B2 | 10/2009 | Miller et al. |
| 2004/0073418 A1* | 4/2004 | Nassif .................. 703/19 |
| 2005/0189960 A1 | 9/2005 | Tajima |
| 2007/0296442 A1* | 12/2007 | Agarwal et al. ............ 324/765 |
| 2008/0030220 A1* | 2/2008 | Agarwal et al. ............ 324/771 |
| 2008/0255792 A1* | 10/2008 | Agarwal et al. ............ 702/119 |
| 2008/0278182 A1* | 11/2008 | Agarwal et al. ............ 324/713 |
| 2009/0160477 A1* | 6/2009 | Agarwal et al. ............ 324/766 |
| 2009/0164155 A1* | 6/2009 | Agarwal et al. ............ 702/65 |

OTHER PUBLICATIONS

Bhushan, et al. "Ring Oscillator Based Technique for Measuring Variability Statistics", International Conference on Microelectronic Test Structures Mar. 6-9, 2006, IEEE Press 2006 pp. 87-92.

Office Action in U.S. Appl. No. 12/147,290 mailed Dec. 17, 2009.

Office Action in U.S. Appl. No. 11/961,442 mailed Oct. 6, 2009.

Final Office Action in U.S. Appl. No. 11/961,442 mailed Mar. 24, 2010.

* cited by examiner

CHARACTERIZATION CIRCUIT FOR FAST DETERMINATION OF DEVICE CAPACITANCE VARIATION

The Present Application is a Division of U.S. patent application Ser. No. 11/961,442, filed on Dec. 20, 2007.

BACKGROUND OF THE INVENTION

1. Field of the Invention

The present invention is related to device characterization methods and circuits, and more particularly to a method and system for determination of parameter variation statistics for devices within a test array.

2. Description of Related Art

Parameter variation/process variation has become increasingly significant as processes have shrunk. Simulation can only provide a level of confidence in the overall yield of design or production, but testing is typically required to determine the true variation of device parameters for particular geometries and processes.

For the reasons given above, test arrays are typically fabricated either on production wafers or as independent test models, to characterize devices for both design verification and production testing purposes. The determination of process and/or parameter variation statistics is a time-consuming and computationally intensive process, especially when a large number of test devices must be evaluated. On the order of 100 samples per computed distribution must be collected over the range of operating parameters to be measured in order to provide a reasonably accurate model, and then the statistics must be computed from the sample values.

Therefore, it would be desirable to provide a faster method and test system for determining parameter variation statistics.

SUMMARY OF THE INVENTION

The above objectives of providing a faster method and system for determining parameter variation statistics for a test array of devices is accomplished in a computer performed method and computer controlled test system. The method is a method of operation of the test system, which may be at least partially embodied in program instructions stored in computer-readable storage media for execution in a test workstation computer system.

The test system and methodology sequentially enable an array of devices under computer control. A test output from the array produces a voltage or current dependent on a device parameter for which a statistical variation is to be determined. The sequentially activation of each device in the array produces a voltage or current waveform at the test output, which is then measured with a digital voltmeter interfaced to the computer. The rms value of the voltage or current provides an indication of the standard deviation of the parameter, and the DC value of the voltage or current provides an indication of the mean value of the parameter.

The foregoing and other objectives, features, and advantages of the invention will be apparent from the following, more particular, description of the preferred embodiment of the invention, as illustrated in the accompanying drawings.

DETAILED DESCRIPTION OF PREFERRED EMBODIMENT

The present invention relates to a process/device characterization method and system that use a digital multi-meter, voltmeter and/or current meter to provide indications of standard deviation and/or mean values of device parameter variation within an array of devices. A test array circuit provides a current or voltage output that provides an indication of at least one device parameter/device characteristic. The devices are sequentially selected to generate a waveform at the test output(s). The waveform(s) is measured using the digital multi-meter, voltmeter and/or current meter to obtain rms and DC average values, which provide a direct indication of the standard deviation and mean of the device parameter distribution, respectively. By using a digital metering device, statistical computation overhead is virtually eliminated as compared to sampling each device and computing the statistics from the sampled distribution. Variations in the resistance of resistors, threshold voltage and other characteristics of transistors, and capacitance of capacitors and transistor terminals can all be measured using the techniques of the present invention.

The method is a computer-performed method embodied in a computer program having program instructions for carrying out the method by controlling a characterization array and performing the above-described voltage and/or current measurements. The variation in device characteristics are determined from the measurement data retrieved from a multi-meter, voltmeter or current meter interfaced to a workstation computer system. The method of the present invention dramatically reduces the amount of time to characterize device parameter variation within an array, permitting greater flexibility in making measurements over large numbers of operating conditions.

Figure 1A:
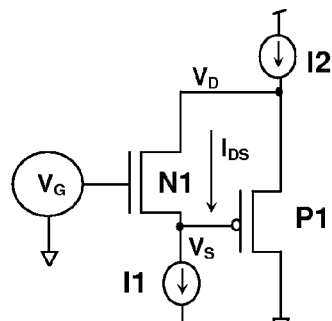
FIG. 1A is a schematic diagram of a transistor parameter characterization circuit.

Referring now to FIG. 1A, a characterization circuit in accordance with an embodiment of the present invention is depicted. Transistor N1 is a device under test for which the threshold voltage $V_T$ is to be determined. Transistor P1 and current source I2 form a source-follower that imposes a constant $V_{DS}$ value across the channel of transistor N1, since the amount of current diverted through P1 is fixed by I1 and I2, any change in $V_S$ results in an equal change in $V_D$ in order to keep $V_{GS}$ of P1 constant. Transistor P1 is generally a thick oxide device having a long channel and operated in the saturation region. Current source I1 fixes the channel current $I_{DS}$ through transistor N1. A constant voltage $V_G$ is imposed on the gate of transistor N1. Therefore, any variation in the threshold voltage ($\Delta V_T$) of device N1 will appear directly as an opposite change in source voltage ($\Delta V_S$) in the depicted measurement circuit, since $\Delta V_G=0$, $\Delta I_{DS}=0$ and therefore $\Delta(V_{GS}-\Delta V_T)=0$.

Figure 1B:
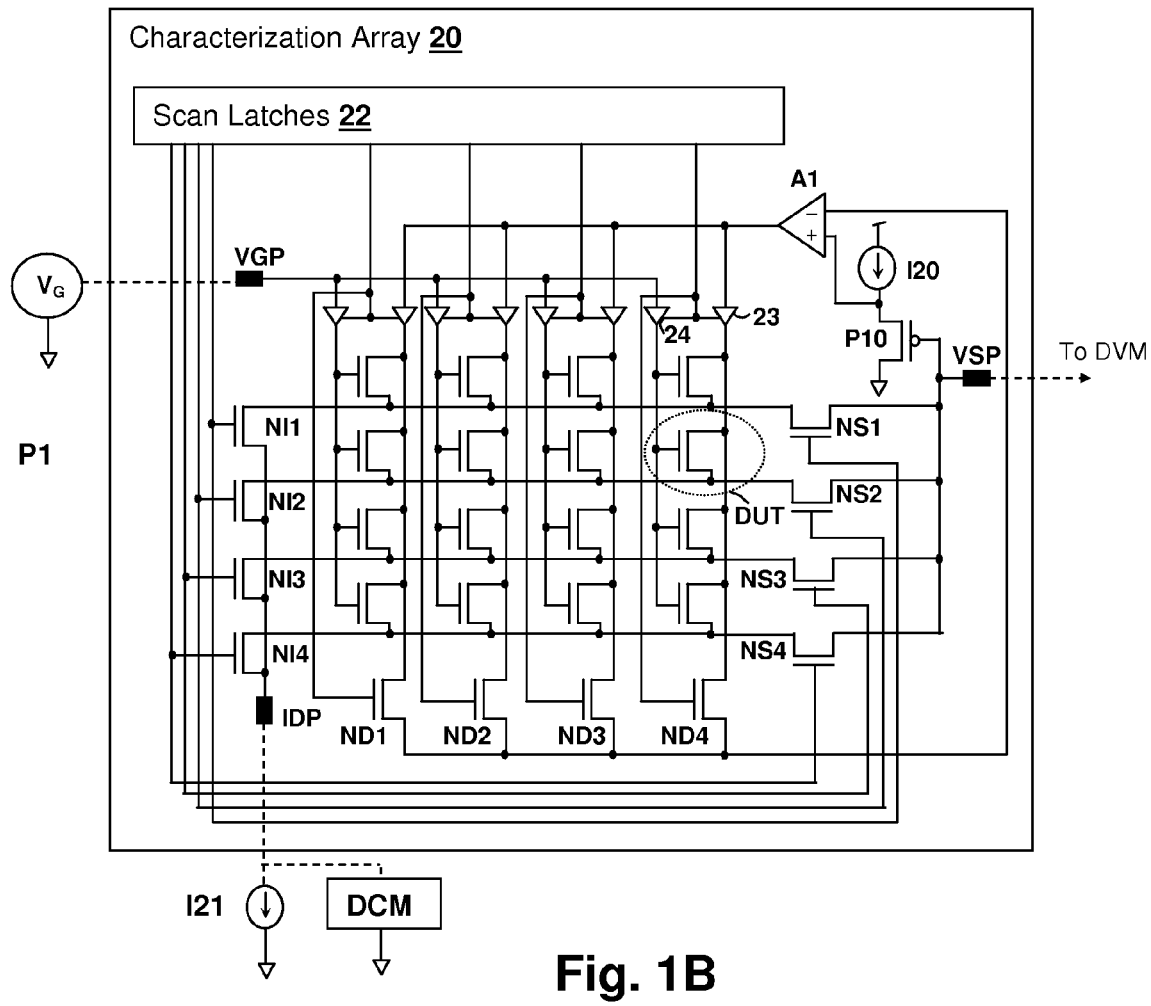
FIG. 1B is a schematic of a transistor characterization array, that may be used in test methodologies and systems according to embodiments of the present invention.

Referring now to FIG. 1B, a characterization array 20 in accordance with an embodiment of the present invention is shown. Characterization array 20 is a test integrated circuit integrated on a die, a wafer kerf or other integrated circuit location that may be experimental only, or occupy one or more die or kerf locations in a production wafer. An array of transistors including device under test DUT is operated in a controlled manner via signals provided by scan latches 22. Although the exemplary embodiment uses scan latches 22 to apply the control signals, it is understood that registers controlled via a control interface or other suitable circuit may be provided to control the operation of characterization array 20. Further, it is understood that although the exemplary embodiment supplies signals to external equipment via pads VGP, IDP and VSP, one or more of the external devices used to operate and evaluate device under test DUT may be integrated within characterization array 20. For example, any or all of voltage source $V_G$, current source I21 and a voltage measurement circuit for measuring the voltage at pad VSP can be integrated on a wafer including characterization array 20.

Signals provided from scan latches 22 select a unique row and column associated with one of the transistors, e.g., device under test DUT. The selection of a row is made by a logical "1" applied to the gate of one of current steering transistors NI1-NI4 and simultaneously to a gate of a corresponding one of source voltage sense transistors NS1-NS4. Scan latches 22 are programmed such that only one row is selected at a time, i.e., all gates of transistors NI1-NI4 and NS1-NS4 are set to logical "0" other than the gates corresponding to the selected row. The selection of a column is made by enabling a transmission gate, e.g., transmission gate 24 that passes a reference gate voltage provided at pad VGP to the gates of all of the transistors in a column of the transistor array. A corresponding transmission gate 23 is also enabled and applies the output of amplifier A1 to the drain of each transistor in the selected column. The gate of a corresponding drain voltage sense transistor ND1-ND4 for the selected column is also set to a logic "1", and provides a sense path for sensing the drain voltage of a column at the inverting input of amplifier A1. Scan latches 22 are sequentially programmed such that only one column is selected at a time, i.e., all transmission gates are disabled and drain voltage sense transistor ND1-ND4 gates are set to logical "0" other than the enabled transmission gates corresponding to the selected column and the gate of the corresponding rain voltage sense transistor ND1-ND4. The selection is performed at a constant rate and therefore a waveform of equal interval values corresponding to the threshold voltage $V_T$ appears at output test point VSP. Sequential selection in the context of the present invention, does not mean that physical order must be maintained, only that the devices are selected in sequence so that their characteristics are reflected in the generated waveform(s).

The source follower circuit described with reference to FIG. 1A is included within characterization array 20, but includes amplifier A1, which forces the drain-source voltage ($V_{DS}$) to be a constant value for each selected transistor in the array. For example, when transistor DUT is selected by enabling transmission gates 23 and 24, along with transistors ND4, NI2 and NS2, transistor ND4 applies the drain voltage of transistor DUT to the inverting input of amplifier A1. Simultaneously, transistor NS2 applies the source voltage of transistor DUT to the gate of source-follower transistor P10, which controls the voltage at the non-inverting input of amplifier A1. The feedback loop acts to hold the drain-source voltage of transistor DUT constant by tracking any changes in the source voltage sensed from the selected row and adjusting the drain voltage supplied to the transistors in the column by an equal amount. Only one of the transistors in the array is conducting current at any time. Current provided from the output of A1 is directed through transmission gate 23 through the channel of transistor DUT and through transistor NI2 to an external stable current source I21. Since the current output of amplifier A1 is supplied to the drains of each transistor in a selected column, but only one selected row has a return path enabled via one of transistors NI1-NI4, only one device is selected for characterization for each valid combination of row and column selection signals provided from scan latches 22.

The above-described characterization array 20 thus provides a mechanism for sequentially selecting each device in the array and sensing changes in the source voltage $V_S$ at pad VSP for a fixed operating point set by the channel current $I_{DS}$ permitted through pad IDP and the gate voltage $V_G$ applied at pad VGP. By setting different valid selection combinations in scan latches 22, each transistor in the array is selected and a value of $V_S$ is measured and collected by a meter such as an external computer-controlled digital voltmeter (DVM) or digital multi-meter (DMM). The present invention concerns the determination of statistical descriptions of threshold voltage variation or other characteristic variation such as $I_{DS}$ variation obtained by replacing current source I21 with a digital current meter (DCM) and forcing fixed voltages at each of the terminals of device under test DUT. RMS measurements obtained from the meter are used as a direct indication of the standard deviation of the variation of the device characteristics and DC (average) measurements obtained from the meter provide a mean value for the characterization array. The mean values between multiple devices can thus be statistically compared to further characterize larger numbers of devices.

Figure 2A:
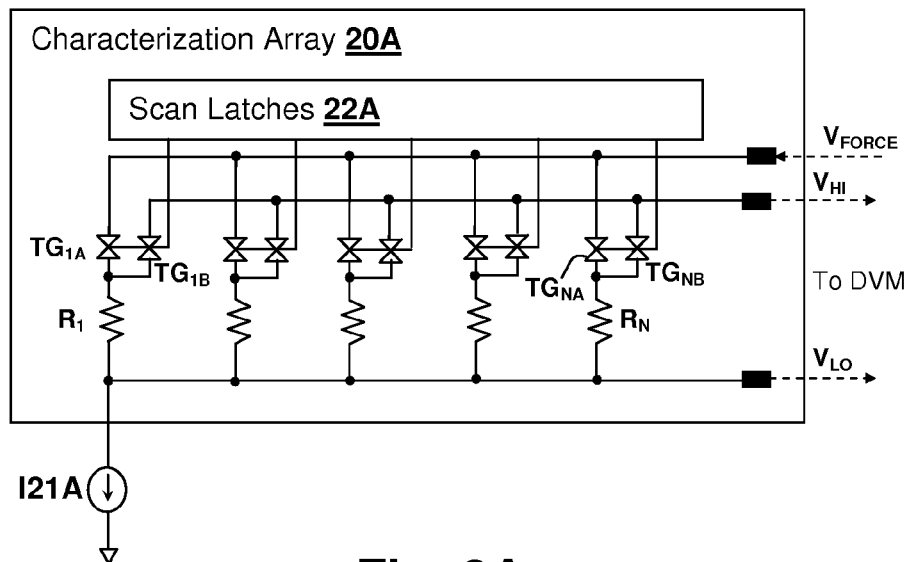
FIG. 2A is a schematic diagram of a resistor characterization circuit.

Referring now to FIG. 2A, a characterization array 20A for characterizing resistance variation is shown. Resistors $R_1$-$R_N$ are individually and sequentially selected using pass gate pairs (transmission gates) TG1A, TG1B through TGNA, TGNB and providing a constant current through the selected resistor using current source I21A. Pass gates TG1A-TGNA provide a voltage source from test point $V_{FORCE}$ that is sufficient to saturate current source I21A for any resistance value of resistors $R_1$-$R_N$ plus the corresponding resistance of the selected one of pass gates TG1A-TGNA. Pass gates TG1B-TGNB provide a sense output at test point $V_{HI}$ so that the resistance of pass gates TG1A-TGNA has no impact on the measured output, which is the voltage between test points $V_{HI}$ and $V_{LO}$. Scan latches 22A control the sequential selection of resistors $R_1$-$R_N$ so that a voltage waveform corresponding to the resistance of resistors $R_1$-$R_N$ is produced across test points $V_{HI}$ and $V_{LO}$. Therefore, the standard deviation of the distribution of the resistance of resistors $R_1$-$R_N$ is obtained from an RMS measurement from a meter connected across test points $V_{HI}$ and $V_{LO}$ and a measure of the mean is obtained from the measured DC (average) voltage.

Figure 2B:
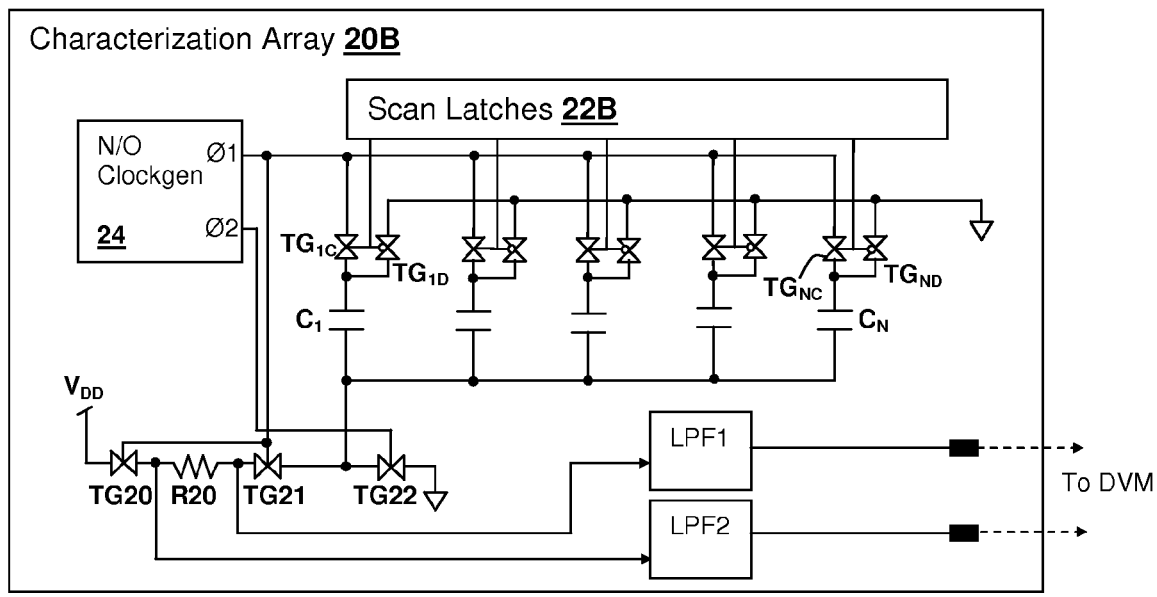
FIG. 2B is a schematic of a characterization array in accordance with an embodiment of the invention, that may be used in test methodologies and systems according to embodiments of the present invention.

Referring now to FIG. 2B, a characterization array 20B for characterizing capacitance is shown. Capacitors C1-CN may be capacitors formed from metal layers of the circuit implementing characterization array 20B, or may be gates of transistors. If transistor gate capacitances are measured, the drain and source terminals must generally be biased in some manner, since the capacitance generally varies non-linearly with the transistor operating point. The above-incorporated U.S. Patent Application "METHOD AND APPARATUS FOR STATISTICAL CMOS DEVICE CHARACTERIZATION" describes biasing techniques for measuring transistor terminal capacitance in detail. The present invention directly measures the statistics of an array of capacitances rather than measuring individual capacitance values as is described in the above-referenced U.S. Patent Application.

First, a set of pass gates $TG_{1D}$-$TG_{ND}$ are all enabled by de-asserting each control output of scan latches 22B to force a first terminal of all of capacitors C1-CN to ground. The other terminal of capacitors C1-CN is a commonly connected node that is continually charged and discharged by the switching action of pass gates TG20, TG21 and TG22, which are operated by non-overlapping clock phases Ø1 and Ø2 provided from a non-overlapping clock generator 24. Thus, during the calibration interval, the current flowing through a resistor R20 connected between pass gates TG20 and TG21 during clock phase Ø1 is the current required to charge the total capacitance of capacitors C1-CN plus any parasitic capacitances to $V_{DD}$ from ground, since during clock phase Ø2, the commonly connected terminals of capacitors C1-CN is discharged to ground. The current flowing through resistor R20 during clock phase Ø2 is zero. Non-overlapping clock generator 24 operates at a high frequency, e.g., 10 MHz and the average current flowing through resistor R20 is dependent on the frequency F of non-overlapping clock generator 24, according to $I_{CAL}=FV_{DD}C_{TOT}$, where $C_{TOT}$ is the total capacitance at the commonly connected node of capacitors C1-CN. The reference current value $I_{CAL}$ can be captured with a DVM connected to the outputs of a pair of low-pass filters LPF1 and LPF2 that have inputs connected to the terminals of resistor R20. The difference between the output voltages of low-pass filters LPF1 and LPF2 is $RFV_{DD}C_{TOT}$ during the calibration interval. Low-pass filters have a passband that does not pass the switching frequency of non-overlapping clock generator 24, but does not filter the frequency at which scan latches 22B are operated to sequentially select capacitors C1-CN for testing during the capacitance statistics measurement, so that the rms value correctly reflects the standard deviation of capacitance. Low-pass filters LPF1 and LPF2 may be integrated on a die including characterization array 20B or may be provided externally as part of the measurement apparatus.

Next, the statistics of the capacitances of capacitors C1-CN are measured by operating scan latches 22B to sequentially enable pass gates $TG_{1C}$-$TG_{NC}$. Corresponding pass gates $TG_{1D}$-$TG_{ND}$ are each disabled as the scan proceeds. Since clock phase Ø1 is applied directly to capacitors C1-CN by pass gates $TG_{1C}$-$TG_{NC}$ as each is enabled and has a value of $V_{DD}$ at that time, during clock phase Ø1, the current through resistor R20 is $I_{MEAS}=FV_{DD}(C_{TOT}-C_{SELECTED})$, where $C_{SELECTED}$ is the capacitance of the capacitors selected for measurement. Thus, the average DC deviation from the difference in output voltages of low-pass filters LPF1 and LPF2 to the difference in output voltages of low-pass filters LPF1 and LPF2 during the selection of capacitors C1-CN is an indication of the mean value of the capacitances of capacitors C1-CN. The rms value of the variation in the difference in output voltages of low-pass filters LPF1 and LPF2 during the selection of capacitors C1-CN is an indication of the standard deviation of the capacitances of capacitors C1-CN.

Figure 3:
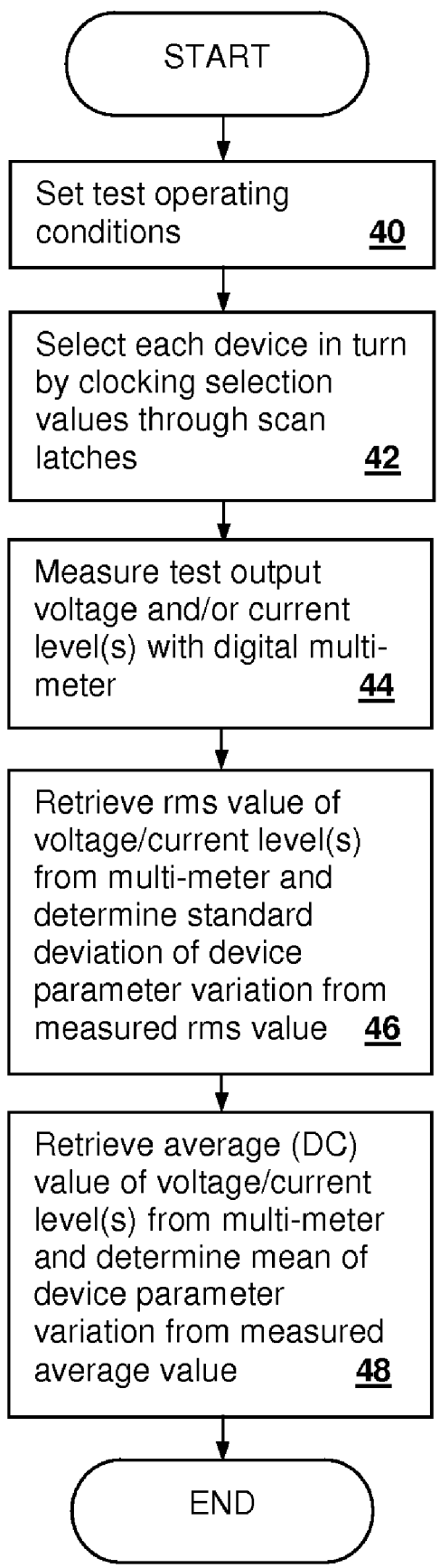
FIG. 3 is a flow chart of a method in accordance with an embodiment of the present invention.

Referring now to FIG. 3, a method according to an embodiment of the invention is depicted in a flowchart. First, the test operating conditions for the characterization array are set, including power supply voltages, temperature and calibration, if required by the measurement (step 40). Next each device is selected in turn by clocking the selection values through scan latches (step 42). The test output voltage and/or current levels are measured with a digital multi-meter (step 44). (Alternatively, a DVM or DCM may be employed, depending on the output value to be measured.) Then, the rms value of the voltage/current level(s) from the multi-meter are retrieved and stored in computer memory. The standard deviation of device parameter variation is determined from the measured rms value(step 46). Finally, the DC average value of the voltage/current measurement is retrieved from the multi-meter and stored in computer memory. The mean value of the device parameter variation is determined from the measured DC average value (step 48).

Figure 4:
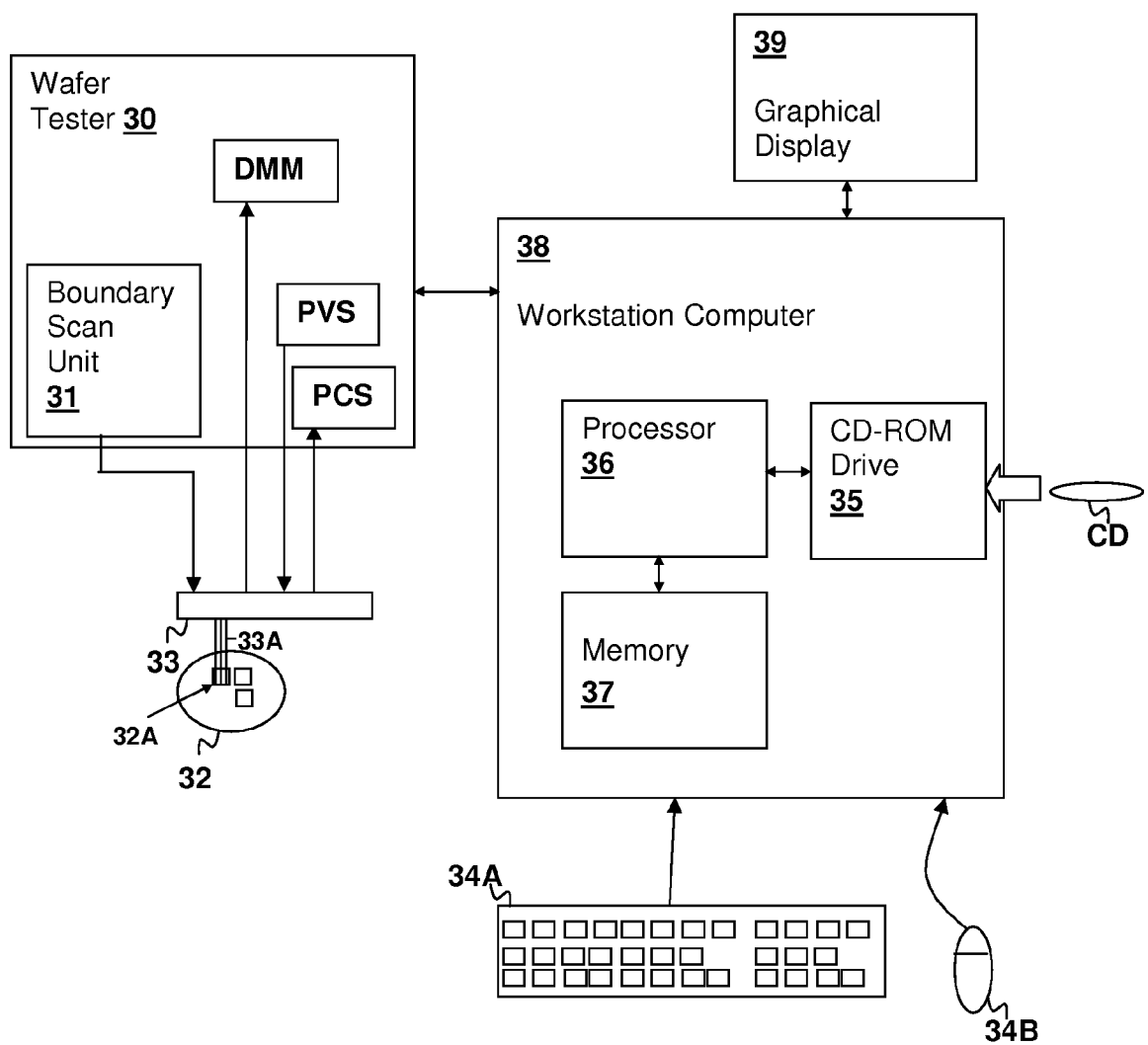
FIG. 4 is a pictorial diagram of a wafer test system in which methods in accordance with an embodiment of the present invention are performed.

Referring now to FIG. 4, a wafer test system in which a method according to an embodiment of the invention is performed, is shown. A wafer tester 30 includes a boundary scan unit 31 for providing stimulus to a die or kerf circuit 32A on a wafer under test 32, via a probe head 33 having electrical test connections 33A to die 32A. Wafer tester 30 also includes a digital multi-meter DMM, which may be part of a parametric measurement unit that also includes a programmable voltage source PVS and a programmable current source PCS, that are all coupled to die 32A via probe head 33 electrical test connections 33A. In the embodiment illustrated in FIG. 1B, the output of programmable voltage source is connected to pad VGP, the output of programmable current source PCS is connected to pad IDP and the input of digital multi-meter DMM is connected to pad VSP. In the embodiment illustrated in FIG. 2A, programmable current source PCS provides current source I21A and the input of digital multi-meter DMM is connected across terminals $V_{HI}$ and $V_{LO}$. In the embodiment illustrated in FIG. 2B, digital multi-meter DMM is connected across the outputs of low-pass filters LPF1 and LPF2.

A workstation computer 38, having a processor 36 coupled to a memory 37, for executing program instructions from memory 37, wherein the program instructions include program instructions for executing one or more methods in accordance with an embodiment of the present invention, is coupled to wafer tester 30, whereby the measurements described above are performed and measurements collected and stored in memory 37 and/or other media storage such as a hard disk. A CD-ROM drive 35 provides for import of program instructions in accordance with embodiments of the present invention that are stored on media such as compact disc CD. Workstation computer 38 is also coupled to a graphical display 39 for displaying program output such as distributions of the threshold voltage for devices in the characterization array provided by embodiments of the present invention. Workstation computer 38 is further coupled to input devices such as a mouse 34B and a keyboard 34A for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 38. Further, workstation computer 38 may be coupled to wafer tester 30 by such a network connection.

While the system of FIG. 4 depicts a configuration suitable for sequential test of a plurality of dies on a wafer, the depicted system is illustrative and not a limitation of the present invention. Probe head 33 may be a multi-die full wafer probe system, or may comprise multiple probe heads for simultaneously testing multiple wafers on a single or multiple die basis. Additionally, while boundary scan control of the characterization array is illustrated, the techniques of the present invention may also be applied to execution of test code from a processor incorporated on wafer 32 with appropriate provided on wafer 32, as well. The resultant generated display or data exported from workstation computer 38 may take the form of graphical depictions of the threshold voltage variation across the characterization array, or may graphical or numerical statistical distribution information that describes the threshold voltage variation.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A device characterization circuit comprising:
   a plurality of capacitive elements to be characterized;
   a first switching circuit for enabling, according to a plurality of control signals, a subset of the plurality of capacitive elements for charging during measurement;
   a test interface for providing said plurality of control signals;
   a clock circuit for providing a clock that controls charging of the subset of capacitive elements at a charging rate;
   a sensing circuit for sensing a current required to charge the subset of capacitive elements, whereby a change in the current due to removing one of the plurality of capacitive elements from the subset is measured as an indication of a capacitance of the capacitive element removed from the subset; and
   at least one low-pass filter for filtering transients at the output of the sensing circuit generated at the charging rate, wherein the charging rate is substantially faster than a switching rate of the first switching circuit.

2. The device characterization circuit of claim 1, wherein the sensing circuit comprises a resistor for generating a voltage proportional to the current required to charge the subset of capacitive elements, and wherein the at least one low-pass filter comprises a pair of low-pass filters each having an input coupled to a different terminal of the resistor, and wherein the outputs of the low-pass filters are provided as outputs for the device characterization circuit for measuring the generated voltage.

3. The device characterization circuit of claim 1, further comprising
   a second switching circuit comprising a pair of switches for coupling a commonly connected terminal of the plurality of capacitive elements between a pair of power supply nodes having differing voltages at the charging rate, and
   wherein the clock circuit provides non-overlapping clocks to the pair of switches.

4. The device characterization circuit of claim 1, wherein the test interface further comprises a plurality of scan latches coupled to the first switching circuit, whereby values written into the scan latches control the selection of the subset of the capacitive elements.

5. The device characterization circuit of claim 1, wherein the plurality of capacitive elements are transistors, wherein capacitances at the gate terminals of the transistors are characterized.

6. The device characterization circuit of claim 1, wherein the plurality of capacitive elements are capacitors formed by metal regions of the device characterization circuit.

7. An integrated circuit, comprising:
   a plurality of capacitive elements to be characterized;
   a first switching circuit for enabling, according to a plurality of control signals, a subset of the plurality of capacitive elements for charging during measurement;
   a test interface for providing said plurality of control signals;
   a clock circuit for providing a clock that controls charging of the subset of capacitive elements at a charging rate;
   a sensing circuit for sensing a current required to charge the subset of capacitive elements, whereby a change in the current due to removing one of the plurality of capacitive elements from the subset is measured as an indication of a capacitance of the capacitive element removed from the subset; and
   at least one low-pass filter for filtering transients at the output of the sensing circuit generated at the charging rate, wherein the charging rate is substantially faster than a switching rate of the first switching circuit, and wherein an output of the at least one low-pass filter is provided at a terminal of the integrated circuit, whereby an external measurement system can be coupled to the output of the at least one low-pass filter.

8. The integrated circuit of claim 7, wherein the sensing circuit comprises a resistor for generating a voltage proportional to the current required to charge the subset of capacitive elements, and wherein the at least one low-pass filter comprises a pair of low-pass filters each having an input coupled to a different terminal of the resistor, and wherein the outputs of the low-pass filters are provided as outputs for the device characterization circuit for measuring the generated voltage.

9. The integrated circuit of claim 7, further comprising
   a second switching circuit comprising a pair of switches for coupling a commonly connected terminal of the plurality of capacitive elements between a pair of power supply nodes having differing voltages at the charging rate, and
   wherein the clock circuit provides non-overlapping clocks to the pair of switches.

10. The device characterization circuit of claim 7, wherein the test interface further comprises a plurality of scan latches coupled to the first switching circuit, whereby values written into the scan latches control the selection of the subset of the capacitive elements.

11. The integrated circuit of claim 7, wherein the plurality of capacitive elements are transistors, wherein capacitances at the gate terminals of the transistors are characterized.

12. The integrated circuit of claim 7, wherein the plurality of capacitive elements are capacitors formed by metal regions of the device characterization circuit.

13. A method of characterizing a plurality of capacitive elements integrated on a die, the method comprising:
   selecting, according to control signals provided from a test interface, a subset from among the plurality of capacitive elements for charging during measurement;
   charging the subset of capacitive elements at a charging rate, wherein said charging is controlled by a clock;
   sensing a current required to perform the charging of the subset of capacitive elements, whereby a change in the current due to removing one of the plurality of capacitive elements from the subset is measured as an indication of a capacitance of the capacitive element removed from the subset; and
   filtering transients from a result of the sensing, wherein the transients are generated at the charging rate which is substantially faster than a rate of the selecting.

14. The method of claim 13, wherein the sensing comprises generating a voltage proportional to the current required to charge the subset of capacitive elements using a resistor, and wherein the filtering is performed using a pair of low-pass filters each having an input coupled to a different terminal of the resistor.

15. The method of claim 13, further comprising alternatively coupling a commonly connected terminal of the plurality of capacitive elements between a pair of power supply nodes having differing voltages at the charging rate.

16. The method of claim 13, wherein the selecting is performed in response to states of a plurality of scan latches coupled to the test interface, whereby values written into the scan latches control the selection of the subset of capacitive elements.

17. The method of claim 13, wherein the plurality of capacitive elements are transistors, wherein capacitances at the gate terminals of the transistors are characterized.

18. The method of claim 13, wherein the plurality of capacitive elements are capacitors formed by metal regions of at least one layer of the die.

* * * * *